US012598893B2

(12) United States Patent
Pei et al.

(10) Patent No.: US 12,598,893 B2
(45) Date of Patent: Apr. 7, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Junqiang Pei, Wuhan (CN); Qi Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 597 days.

(21) Appl. No.: 18/003,439

(22) PCT Filed: Sep. 5, 2022

(86) PCT No.: PCT/CN2022/116938
§ 371 (c)(1),
(2) Date: Dec. 27, 2022

(87) PCT Pub. No.: WO2024/016439
PCT Pub. Date: Jan. 25, 2024

(65) Prior Publication Data
US 2024/0306472 A1      Sep. 12, 2024

(30) Foreign Application Priority Data
Jul. 19, 2022    (CN) .......................... 202210851750.4

(51) Int. Cl.
*H10K 59/80*        (2023.01)
*H10K 102/00*       (2023.01)

(52) U.S. Cl.
CPC ..... *H10K 59/873* (2023.02); *H10K 2102/311* (2023.02)

(58) Field of Classification Search
None
See application file for complete search history.

(56) References Cited

U.S. PATENT DOCUMENTS

2015/0108439 A1*    4/2015    Kim ..................... H10K 59/126
257/40
2016/0293895 A1    10/2016    Kim
(Continued)

FOREIGN PATENT DOCUMENTS

CN        105158948 A      12/2015
CN        106976277 A      7/2017
(Continued)

OTHER PUBLICATIONS

Chinese Office Action issued in corresponding Chinese Patent Application No. 202210851750.4 dated Nov. 8, 2023, pp. 1-7.
(Continued)

*Primary Examiner* — Kyoung Lee

(57)        ABSTRACT

A display panel and a display device are provided. The display panel includes a panel main body, a backplate, and a polarizer sheet. The backplate is disposed on a side of the panel main body. The polarizer sheet is disposed on a side of the panel main body away from the backplate. Wherein, a thickness of the backplate is greater than a thickness of the polarizer sheet at least in the corner curved-surface sub-region of the display panel.

20 Claims, 8 Drawing Sheets

(56)               References Cited

U.S. PATENT DOCUMENTS

| | | | |
|---|---|---|---|
| 2019/0081255 A1 | 3/2019 | Kim et al. | |
| 2020/0057525 A1* | 2/2020 | Prest ................... | G06F 3/04886 |
| 2020/0209916 A1 | 7/2020 | Zhang et al. | |

FOREIGN PATENT DOCUMENTS

| | | | |
|---|---|---|---|
| CN | 107367787 | A | 11/2017 |
| CN | 109860422 | A | 6/2019 |
| CN | 212392267 | U | 1/2021 |
| CN | 112735270 | A | 4/2021 |
| CN | 112863354 | A | 5/2021 |
| CN | 113689787 | A | 11/2021 |
| CN | 214897341 | U | 11/2021 |
| CN | 114078384 | A | 2/2022 |
| CN | 114495744 | A | 5/2022 |
| CN | 114664193 | A | 6/2022 |
| CN | 216980031 | U | 7/2022 |
| JP | 2017102276 | A | 6/2017 |

OTHER PUBLICATIONS

International Search Report in International application No. PCT/CN2022/116938, mailed on Dec. 28, 2022.
Written Opinion of the International Search Authority in International application No. PCT/CN2022/116938, mailed on Dec. 28, 2022.
Chinese Office Action issued in corresponding Chinese Patent Application No. 202210851750.4 dated Apr. 18, 2023, pp. 1-7.

* cited by examiner 1022 (102)

1021 (102)

101

DISPLAY PANEL AND DISPLAY DEVICE

BACKGROUND OF INVENTION

Field of Invention

The present invention relates to a field of display technology, and particularly to a display panel and a display device having the display panel.

Description of Prior Art

With change of people's aesthetic level and development of mobile terminal products, people gradually pursue mobile phone terminals with appearances having rounded curves, and many curved-surface screen terminals have also appeared in markets. In current multi-curved-surface screens, two lateral side thereof are curved surfaces, i.e., double curved surfaces. Although there are many products of the double curved surfaces and technical researches of which are becoming increasingly perfect, four-curved-surface screens have gradually become a hot spot in the markets due to their advantages of more beautiful curves, differentiated appearances, and bezel-free on four sides in a front view. The four-curved-surface screens are also one of inevitable trends in development of mobile terminals.

In the four-curved-surface screens, wrinkles easily generate in curved-surface regions, especially in corner regions. Due to existence of the wrinkles, screen encapsulations are easy to be broken, and black spots appear.

SUMMARY OF INVENTION

Embodiments of the present invention provides a display panel and a display device, which can lower probability of wrinkles generated in display panels and can improve yield of the display panels and display effect in corner curved-surface sub-regions.

One embodiment of the present invention provides a display panel. The display panel includes a planar display region and a curved-surface display region neighboring with the planar display region. The curved-surface display region includes a plurality of lateral-side curved-surface sub-regions defined on periphery of the planar display region and a corner curved-surface sub-region connected between adjacent two of the lateral-side curved-surface sub-regions.

The display panel includes:

a panel main body;

a backplate disposed on a side of the panel main body; and a polarizer sheet disposed on a side of the panel main body away from the backplate, wherein at least in the corner curved-surface sub-region, a thickness of the backplate is greater than a thickness of the polarizer sheet.

In one embodiment of the present invention, the thickness of the backplate is greater than the thickness of the polarizer sheet in the lateral-side curved-surface sub-region.

In one embodiment of the present invention, the thickness of the backplate in the corner curved-surface sub-region is greater than the thickness of the backplate in the lateral-side curved-surface sub-region.

In one embodiment of the present invention, the thickness of the backplate is greater than the thickness of the polarizer sheet in the planar display region.

In one embodiment of the present invention, the thickness of the backplate in the curved-surface display region is greater than the thickness of the backplate in the planar display region.

In one embodiment of the present invention, the thickness of the backplate in the corner curved-surface sub-region is equal to the thickness of the backplate in the lateral-side curved-surface sub-region and is equal to the thickness of the backplate in the planar display region.

In one embodiment of the present invention, in the corner curved-surface sub-region, the thickness of the backplate gradually increases along a direction away from the planar display region.

In one embodiment of the present invention, at least in the corner curved-surface sub-region, the thickness of the backplate is greater than or equal to 90 μm and is less than or equal to 250 μm, and the thickness of the polarizer sheet is less than or equal to 106 μm.

In one embodiment of the present invention, at least in the corner curved-surface sub-region, a difference between the thickness of the backplate and the thickness of the polarizer sheet is greater than or equal to 40 μm.

In one embodiment of the present invention, the display panel includes an adhesive layer disposed on a side of the polarizer sheet away from the display panel and a cover plate disposed on a side of the adhesive layer away from the polarizer sheet, and a thickness of the adhesive layer is greater than the thickness of the backplate at least in the corner curved-surface sub-region.

In one embodiment of the present invention, at least in the corner curved-surface sub-region, the thickness of the adhesive layer is greater than or equal to 100 μm and is less than or equal to 200 μm.

In one embodiment of the present invention, the backplate includes a backplate body and a thickened portion disposed on a side of the backplate body close to the panel main body or a side of the backplate body away from the panel main body, and the thickened portion is at least disposed in the corner curved-surface sub-region.

In one embodiment of the present invention, a material of the thickened portion is same or different as a material of the backplate body.

In one embodiment of the present invention, the backplate body includes a first sub-section disposed in the planar display region and a second sub-section disposed in the corner curved-surface sub-region, and an elasticity modulus of the first sub-section is greater than an elasticity modulus of the second sub-section.

In one embodiment of the present invention, the backplate is bent along a side away from the panel main body in the curved-surface display region; and wherein the thickened portion is located on a side of the backplate body close to the panel main body and is located in the corner curved-surface sub-region, and an elasticity modulus of the thickened portion is greater than the elasticity modulus of the second sub-section and is less than the elasticity modulus of the first sub-section; or the thickened portion is located on a side of the backplate away from the panel main body and is located in the corner curved-surface sub-region, and the elasticity modulus of the thickened portion is less than the elasticity modulus of the second sub-section.

In one embodiment of the present invention, the panel main body includes a substrate and a display function layer disposed on a side of the substrate close to the polarizer sheet, the substrate includes a first organic flexible layer and a second organic flexible layer, the second organic flexible layer is located between the first organic flexible layer and the display function layer, and a thickness of the first organic flexible layer is less than 10 μm.

In one embodiment of the present invention, a thickness of the first organic flexible layer is greater than or equal to 6 µm.

In one embodiment of the present invention, the panel main body further includes an encapsulation layer disposed on a side of the display function layer away from the substrate, the encapsulation layer includes a first inorganic layer, an organic layer, and a second inorganic layer disposed in a stack, and a thickness of the organic layer is less than or equal to 10 µm.

In one embodiment of the present invention, in the corner curved-surface sub-region, at least part of the display panel is curved in a form of a Gaussian curve surface, the panel main body is attached to the display panel curved in the form of the Gaussian curve surface, and a compression rate of the display panel curved in the form of the Gaussian curve surface is greater than or equal to 0.2.

According to the aforesaid of the present invention, one embodiment of the present invention further provides a display device. The display device includes a device main body and the display panel, and the device main body and the display panel are assembled in one piece.

The display panel includes a planar display region and a curved-surface display region neighboring with the planar display region. The curved-surface display region includes a plurality of lateral-side curved-surface sub-regions defined on periphery of the planar display region and a corner curved-surface sub-region connected between adjacent two of the lateral-side curved-surface sub-regions.

The display panel further includes:

a panel main body;

a backplate disposed on a side of the panel main body; and a polarizer sheet disposed on a side of the panel main body away from the backplate, wherein at least in the corner curved-surface sub-region, a thickness of the backplate is greater than a thickness of the polarizer sheet.

In the present invention, by designing the thickness of the stacked structure of the display panel, the thickness of the backplate is greater than the thickness of the polarizer sheet at least in the corner curved-surface sub-region. Therefore, compared to the prior art, the thickness of the backplate located in the corner curved-surface sub-region can be increased. By increasing the thickness of the backplate in the corner curved-surface sub-region, a stress threshold of wrinkles generated in the display panel is increased, and probability of the wrinkles generated in the display panel is reduced, so as to improve yield of the display panel and display effect in the corner curved-surface sub-region.

DESCRIPTION OF DRAWINGS

The technical solutions and other advantageous effects of the present invention will be apparent with reference to the following accompanying drawings and detailed description of embodiments of the present invention.

DETAILED DESCRIPTION OF EMBODIMENTS

Figure 1:
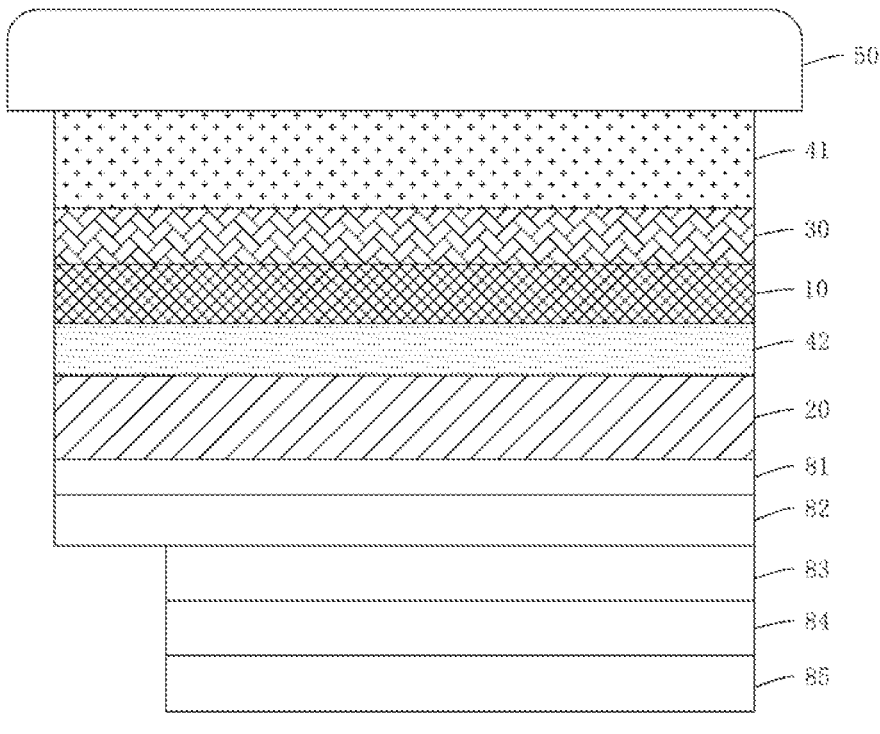
FIG. 1 is a structural schematic diagram of a display panel provided by one embodiment of the present invention.

The technical solutions in the embodiments of the present invention are clearly and completely described in the following with reference to the accompanying drawings in the embodiments of the present invention. Obviously, the described embodiments are only part of the embodiments of the present invention, but are not all embodiments of the present invention. All other embodiments obtained by those skilled in the art based on the embodiments of the present invention without creative efforts are within the scope of the present invention.

The following disclosure provides many different embodiments or examples for implementing the different structures of the present invention. In order to simplify the disclosure of the present invention, the components and configurations of the specific examples are described below. Of course, they are merely examples and are not intended to limit the present invention. In addition, the present invention may repeat reference numerals and/or reference numerals in different examples, which are for the purpose of simplicity and clarity, and do not indicate the relationship between the various embodiments and/or arrangements discussed. Moreover, the present invention provides embodiments of various specific processes and materials, but one of ordinary skill in the art will recognize the use of other processes and/or the use of other materials.

One embodiment of the present invention provides a display panel. Please combine with FIG. 1, the display panel includes a planar display region 101 and a curved-surface display region 102 neighboring with the planar display region 101. Furthermore, the curved-surface display region 102 includes a plurality of lateral-side curved-surface sub-regions 1021 defined on periphery of the planar display region 101 and a corner curved-surface sub-region 1022 connected between two adjacent lateral-side curved-surface sub-regions 1021.

The display panel further includes a panel main body 10, a backplate 20, and a polarizer sheet 30. Furthermore, the backplate 20 is disposed on a side of the panel main body 10, and the polarizer sheet 30 is disposed on a side of the panel main body 10 away from the backplate 20.

Wherein, at least in the corner curved-surface sub-region 1022, a thickness of the backplate 20 is greater than a thickness of the polarizer sheet 30.

In processes of implementation and application, the thickness of the backplate 20 is made to be greater than a thickness of the polarizer sheet 30 at least in the corner curved-surface sub-region 1022 in the embodiment of the present invention. Therefore, compared to a thickness of a polarizer sheet being generally greater than a thickness of a backplate in the prior art, the embodiment of the present invention can increase the thickness of the backplate 20 in the corner curved-surface sub-region 1022 and make the thickness be greater than the thickness of the polarizer sheet 30. Therefore, by increasing the thickness of the backplate 20 in the corner curved-surface sub-region 1022, a stress threshold of wrinkles generated in the display panel is increased, and probability of the wrinkles generated in the display panel is reduced, so as to improve yield of the display panel and display effect in the corner curved-surface sub-region 1022.

Figure 2:
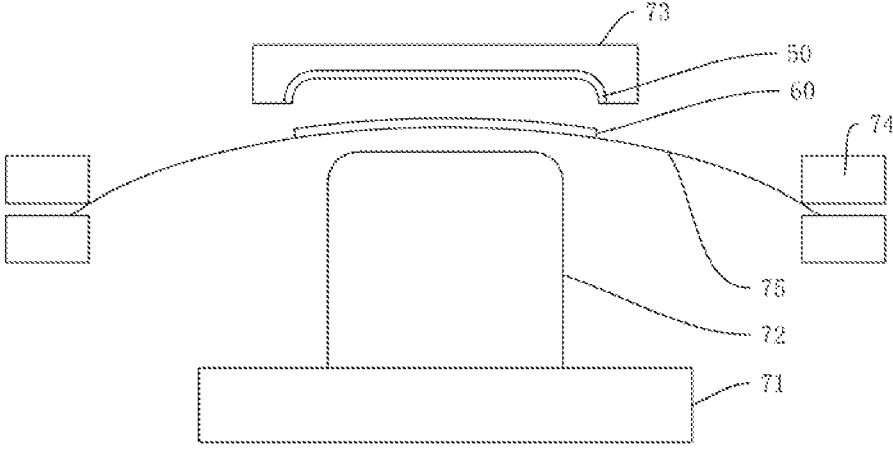
FIG. 2 is a structural schematic diagram of a bending process of the display panel provided by one embodiment of the present invention.

Specifically, please continue referring to FIG. 1 and FIG. 2. The display panel includes a panel main body 10, a backplate 20, a polarizer sheet 30, and a cover plate 50. Wherein, the backplate 20 is attached to a side of the panel main body 10 through the first adhesive layer 42, the polarizer sheet 30 is disposed on a side of the panel main body 10 away from the backplate 20, and the cover plate 50 is attached to a side of the polarizer sheet 30 away from the panel main body 10 through an adhesive layer 41.

It can be understood that the polarizer sheet 30 is located on a light-exiting side of the panel main body 10 to serve effects of reducing reflected light and improving display effect. Furthermore, backplate 20 is located on a side of the panel main body 10 facing back to the light-exiting side to serve effects of support and protection to the panel main body 10.

Furthermore, the display panel includes a display region, and the display region includes the planar display region 101 and the curved-surface display region 102 neighboring with the planar display region 101. Wherein, the curved-surface display region 102 includes a plurality of lateral-side curved-surface sub-regions 1021 defined on periphery of the planar display region 101 and a corner curved-surface sub-region 1022 connected between two adjacent lateral-side curved-surface sub-regions 1021.

It should be noted that, in one embodiment of the present invention, the display panel can be a four-curved-surface display panel, i.e., a number of the lateral-side curved-surface sub-region 1021 is four. In addition, corners are formed between any two adjacent lateral-side curved-surface sub-regions 1021, i.e., corner curved-surface sub-regions 1022 are formed. Besides, in the curved-surface display region 102, the display panel is bent toward a side away from the light-emitting side to form the four-curved-surface display panel. The embodiment of the present invention is described by taking the number of the curved surfaces and the bending direction of the display panel as an example, but it is not limited thereto.

Wherein, it has been verified that the wrinkles of the curved-surface display panels are mainly generated in processes of attaching the cover plate. Please combine FIG. 1 and FIG. 2, which are structural schematic diagrams of a display module 60 attached to the cover plate 50 in one embodiment of the present invention. When the cover plate 50 is attached, the display module is not completely manufactured at this time. At the time, the display module 60 can mainly include the backplate 20, a first adhesive layer 42, the panel main body 10, the polarizer sheet 30, and adhesive layer 41 which are laminated. The aforesaid module structure is attached to the cover plate 50 through attaching equipment. Wherein, the attaching equipment includes a lower machine 71, a bending element 72 disposed on the lower machine 71, an upper machine 73 disposed above the lower machine 71, a fixed clamping mechanism 74 disposed between the lower machine 71 and the upper machine 73, and a carrier substrate 75 clamped and fixed by the fixed clamping mechanism 74. Specifically, the display module 60 is placed on the carrier substrate 75, the cover plate 50 is placed in the upper machine 73, and a bending curvature of the cover plate 50 is consistent with a bending curvature of the upper machine 73. Then, the lower machine moves upward and takes with the bending element 72, so that both the carrier substrate 75 and the display module 60 are bent and are attached to a side of the cover plate 50 close to the display module 60 to form an attachment of a Gaussian curved surface at the corner. In the embodiment of the present invention, it is verified and found that during the attaching process of the display module 60 and the cover plate 50, because a curved surface area of the display module 60 at the corner is larger than a curved surface area of the cover plate 50 at the corner, the wrinkles are formed easily.

Figure 3:
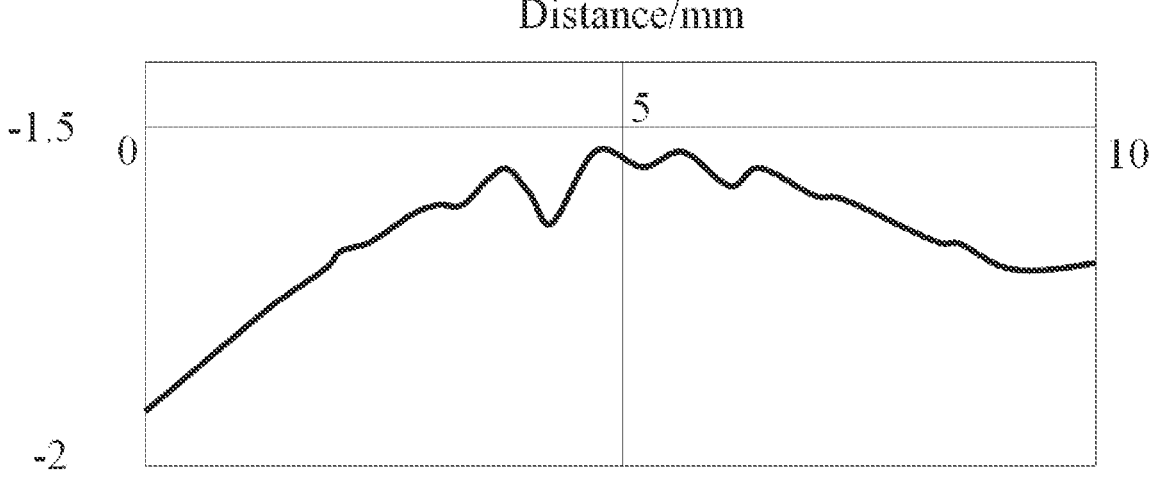
FIG. 3 is a characterized curve diagram of wrinkle extent of the display panel provided by one embodiment of the present invention.
Figure 4:
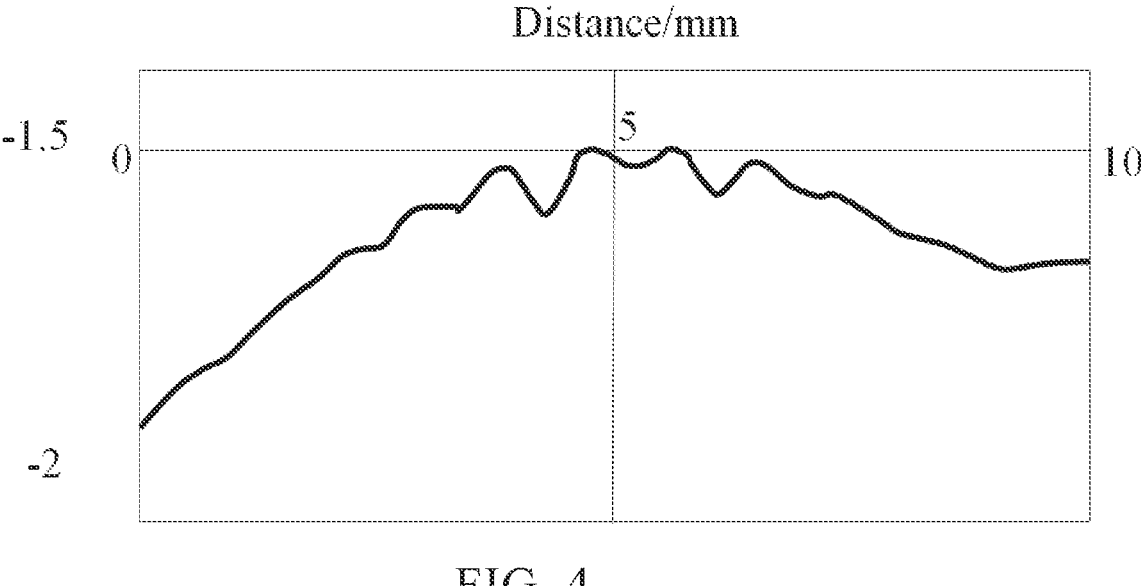
FIG. 4 is another characterized curve diagram of wrinkle extent of the display panel provided by one embodiment of the present invention.
Figure 5:
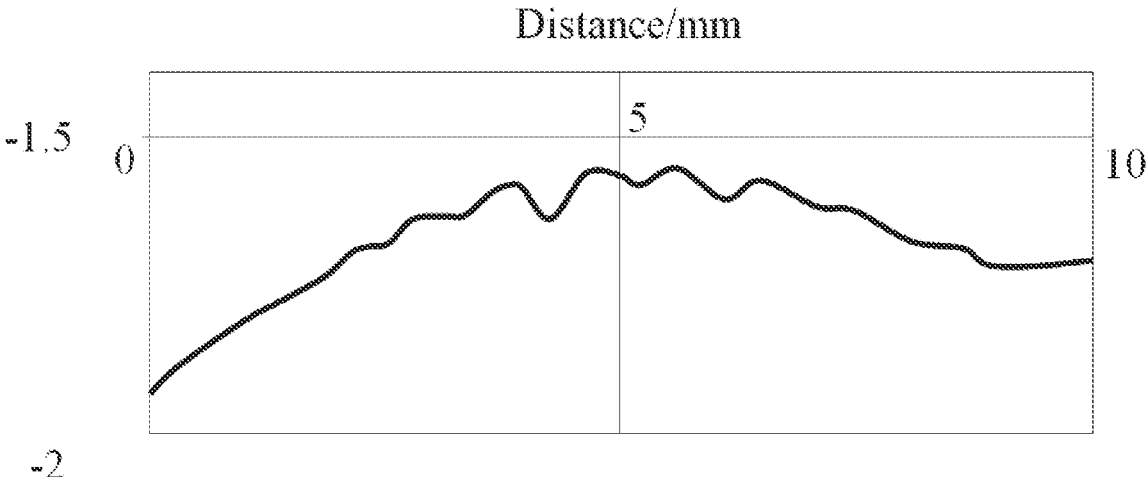
FIG. 5 is another characterized curve diagram of wrinkle extent of the display panel provided by one embodiment of the present invention.

Therefore, in one embodiment of the present invention, a plurality of repeated multi-factor experiments are performed to verify thickness relationships between film layers in the display panel, and it is found that the wrinkling phenomenon at the corner of the display panel can be significantly eased by increasing the thickness of the backplate 20. Please refer to FIG. 1, FIG. 3, FIG. 4, and FIG. 5. Wherein, FIG. 3, FIG. 4, and FIG. 5 are characterization results of the extent of the wrinkles generated in the corner curved-surface sub-region 1022 in the display panel during the backplates 20 having different thicknesses and different size relationship between the backplate 20 and the polarizer 30 in the corner curved-surface sub-region 1022 in embodiments of the present invention. Wherein, the thickness of the backplate 20 corresponding to FIG. 3 is 60 μm, the thickness of the backplate 20 corresponding to FIG. 4 is 90 μm, the thickness of the backplate 20 corresponding to FIG. 5 is 150 μm, and the thicknesses of the polarizer sheet 30 corresponding to FIG. 3, FIG. 4, and FIG. 5 are 106 μm.

It can be understood that for the convenience of verification, the thickness of the backplate 20 and the thickness of the polarizer sheet 30 in FIG. 3, FIG. 4, and FIG. 5 provided by the embodiments of the present invention are all the thicknesses of entire surfaces of the backplate 20 and the polarizer sheet 30, but an verification area is the corner curved-surface sub-region 1022 of the display panel.

Wherein, it can be obtained from FIG. 3 that a maximum wrinkle amplitude of the display panel is 0.074 mm, it can be obtained from FIG. 4 that a maximum wrinkle amplitude of the display panel is 0.064 mm, and it can be obtained from FIG. 5 that a maximum wrinkle amplitude of the display panel is 0.052 mm. Wherein, a maximum wrinkle amplitude represents a maximum distance between a crest and a trough of a wrinkle waveform, i.e., the smaller the maximum wrinkle amplitude is, the less the extent of the wrinkles generated in the display panel is. From the above, it can be understood that with increment of the thickness of the backplate 20, the maximum wrinkle amplitude of the wrinkles generated in the display panel is decreasing, i.e., the extent of the wrinkles generated in the display panel is decreasing. Furthermore, compared the characterization results of the extent of the wrinkle generated in the display panel in FIG. 5 with the characterization results of the extents of the wrinkle generated in the display panel in FIG. 3 and FIG. 4, it can be understood that the maximum wrinkle amplitude of the display panel decreases to a greater extent when the thickness of the backplate 20 is greater than the thickness of the polarizer sheet 30. Therefore, it can be proved that in the embodiments of the present invention, by increasing the thickness of the backplate 20 and configuring the thickness of the backplate 20 to be greater than the thickness of the polarizer sheet 30, the extent of the wrinkles generated in the display panel in the corner curved-surface sub-region 1022 can be effectively lowered, the yield of the display panel can be improved, and display effect of the curved surface of the display panel can be improved.

The film layer structure of the display panel provided by the present invention is described in detail below in combined with specific embodiments.

Figure 6:
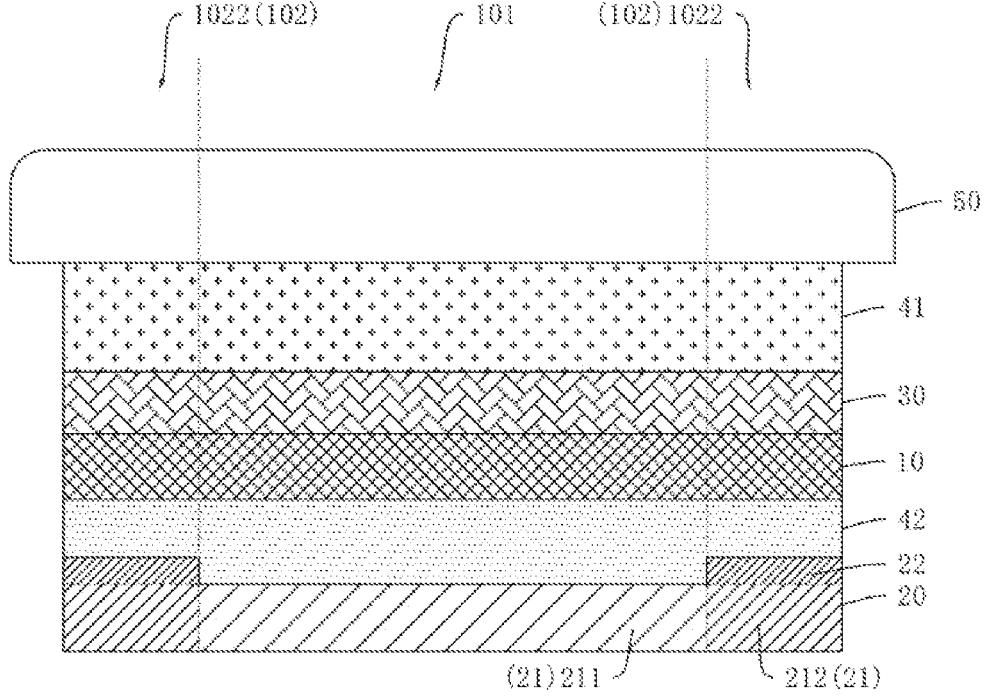
FIG. 6 is another structural schematic diagram of the display panel provided by one embodiment of the present invention.
Figure 7:
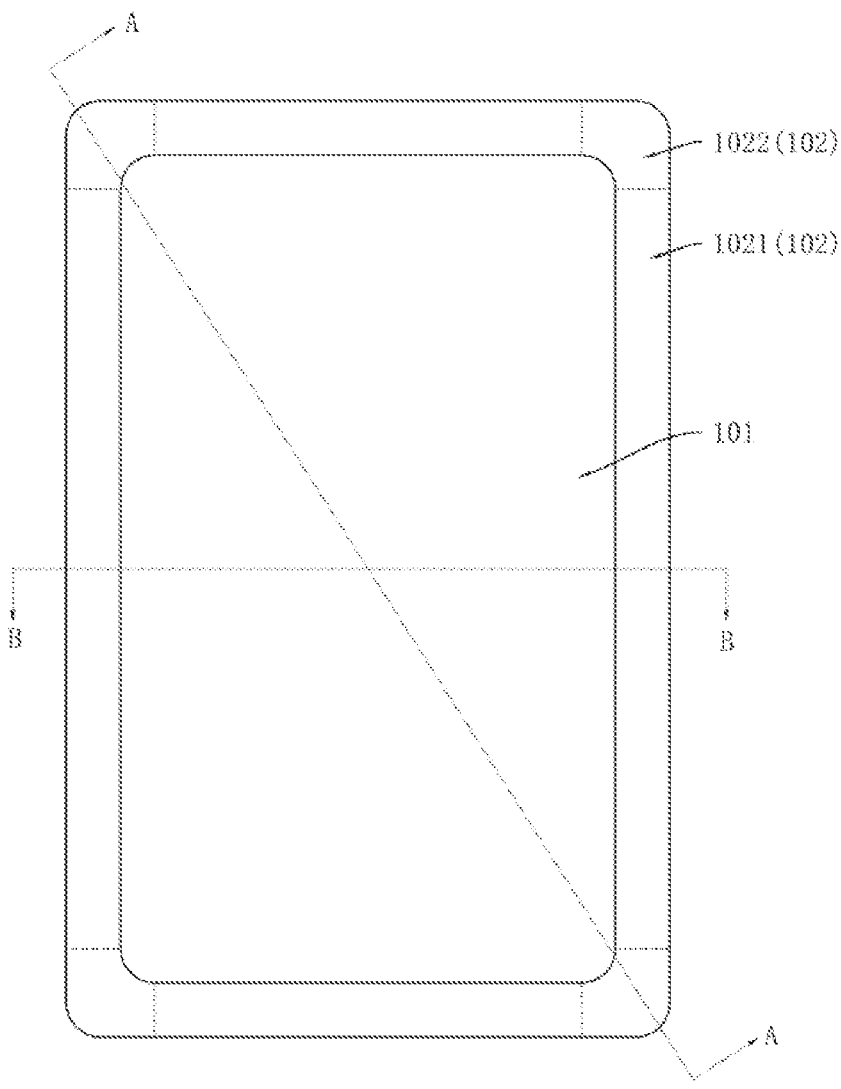
FIG. 7 is a structural schematic diagram of planar distribution of the display panel provided by one embodiment of the present invention.

In one embodiment of the present invention, please refer to FIG. 6 and FIG. 7, and FIG. 6 can be a schematic diagram of a sectional structure along line AA in FIG. 7. In this embodiment, at least in the corner curved-surface sub-region 1022, the thickness of the backplate 20 is greater than the thickness of the polarizer sheet 30. That is, in the embodiment of the present invention, the thickness of the backplate 20 is at least increased in the corner curved-surface sub-region 1022, so that it is made to be greater than the thickness of the polarizer sheet 30.

In one embodiment of the present invention, in the corner curved-surface sub-region 1022, at least part of the display panel is curved in a form of a Gaussian curve surface, and a compression rate of the display panel curved in the form of the Gaussian curve surface is greater than or equal to 0.2. That is, each of the film layers attached in the at least part of the display panel in the corner curved-surface sub-region 1022 is curved in the form of the Gaussian curve surface, and a bending curvature of the film layers is relatively large. The film layers specifically include the backplate 20, the panel main body 10, the polarizer sheet 30, and the adhesive layer 41. In the prior art, the backplate 20, the panel main body 10, the polarizer sheet 30, and the adhesive layer 41 in the display panel need to be attached to the cover plate 50 curved in the form of the Gaussian curved surface at corners. However, the curved surface areas of the backplate 20, the panel main body 10, the polarizer sheet 30, and the adhesive layer 41 at the corners are relatively large and are larger than the curved surface area of the cover plate 50 located at the corners, so that the wrinkles are easily generated, resulting in stress concentration, easily causing encapsulation failure, and generating the problem of dark spots. However, in the embodiments of the present invention, the thickness of the backplate 20 located in the corner curved-surface sub-region 1022 can be increased, which is greater than the thickness of the polarizer sheet 30, so as to increase the thickness of the backplate 20 located in the corner curved-surface sub-region 1022 to increase the stress threshold of generation of the wrinkles in the display panel. Therefore, the backplate 20 is made to be more easily bent into the Gaussian curved surface in the corner curved-surface sub-region 1022, and the probability of wrinkles generated in display panels is lowered. In this way, the display panel is allowed to be more easily bent into the Gaussian curved surface in the corner curved-surface sub-region 1022, so as to improve the yield of the display panel and the display effect in the corner curved-surface sub-region 1022, and to improve the display effect of the curved surface of the display panel.

Additionally, in one embodiment of the present invention, the thickness of the backplate 20 is thickened in the corner curved-surface sub-region 1022, i.e., the backplate 20 includes a backplate body 21 and a thickened portion 22 disposed on the backplate body 21, and the thickened portion 22 is located in the corner curved-surface sub-region 1022.

It can be understood that the thickness of the backplate 20 in the corner curved-surface sub-region 1022 is greater than the thickness of the backplate 20 in the lateral-side curved-surface sub-region 1021 and the planar display region 101.

In this embodiment, the thickened portion 22 is disposed on a side of the backplate body 21 close to the panel main body 10, and a thickness of the thickened portion 22 is uniform. A thickness of the first adhesive layer 42 in the corner curved-surface sub-region 1022 is less than a thickness of the first adhesive layer 42 out of the corner curved-surface sub-region 1022. That is, the side of the first adhesive layer 42 away from the backplate 20 can be a plane, so as to compensate for a level difference generated by the backplate 20 to improve a bonding yield between the backplate 20 and the panel main body 10.

Furthermore, the backplate body 21 includes a first sub-section 211 disposed in the planar display region 101 and a second sub-section 212 disposed in the corner curved-surface sub-region 1022, and an elasticity modulus of the thickened portion 22 and an elasticity modulus of the second sub-section 212 are both less than the elasticity modulus of the first sub-section 211. Because the thickened portion 22 and the second sub-section 212 are located in the corner curved-surface sub-region 1022, they need to enter the Gaussian surface for bending. Therefore, the elastic modulus of the thickened portion 22 and the second sub-section 212 are configured to be smaller than the elasticity modulus of the first sub-section 211 to improve flexibility of the thickened portion 22 and the second sub-section 212, thereby reducing a bending stress. Moreover, the elasticity modulus of the second sub-section 212 is less than the elasticity modulus of the thickened portion 22. When the display panel is bent, as the second sub-section 212 is located on a bending inner side, the second sub-section 212 suffers more extrusion and bending stress than the thickened portion 22. Therefore, the elastic modulus of the second sub-section 212 is configured to be smaller to further improve the flexibility of the second sub-section 212.

Optionally, the elasticity modulus of the first sub-section 211 can be greater than or equal to 3300 Mpa and less than or equal to 3700 Mpa, and the elasticity modulus of the second sub-section 212 and the elasticity modulus of the thickened portion 22 can be both greater than or equal to 2500 Mpa and less than or equal to 3000 Mpa.

Optionally, a material of the thickened portion 22 is same or different as a material of the backplate body 21, and the material of the thickened portion 22 and the material of the backplate body 21 can both include polyethylene terephthalate or polyimide.

In one embodiment of the present invention, a material of the adhesive layer 41 can include optically clear adhesive (OCA). Furthermore, in one embodiment of the present invention, at least in the corner curved-surface sub-region 1022, the thickness of the adhesive layer 41 is greater than the thickness of the backplate 20. That is, the thickness of the adhesive layer 41 is also increased. In this way, the adhesive layer 41 located in the corner curved-surface sub-region 1022 is increased, so as to increase the stress threshold of wrinkles generated in the display panel, to lower probability of the wrinkles generated in the display panel, and to improve yield of the display panel and display effect in the corner curved-surface sub-region 1022.

Continuing from the above, in the embodiments of the present invention, the thickness of the backplate 20 is made to be greater than the thickness of the polarizer sheet 30 at least in the corner curved-surface sub-region 1022. Therefore, compared to the thickness of the polarizer sheet being generally greater than the thickness of a backplate in the prior art, the thickness of the backplate 20 located in the corner curved-surface sub-region 1022 can be increased. By increasing the thickness of the backplate 20 in the corner curved-surface sub-region 1022, the stress threshold of wrinkles generated in the display panel is increased, and probability of the wrinkles generated in the display panel is reduced, so as to improve yield of the display panel and display effect in the corner curved-surface sub-region 1022.

Figure 8:
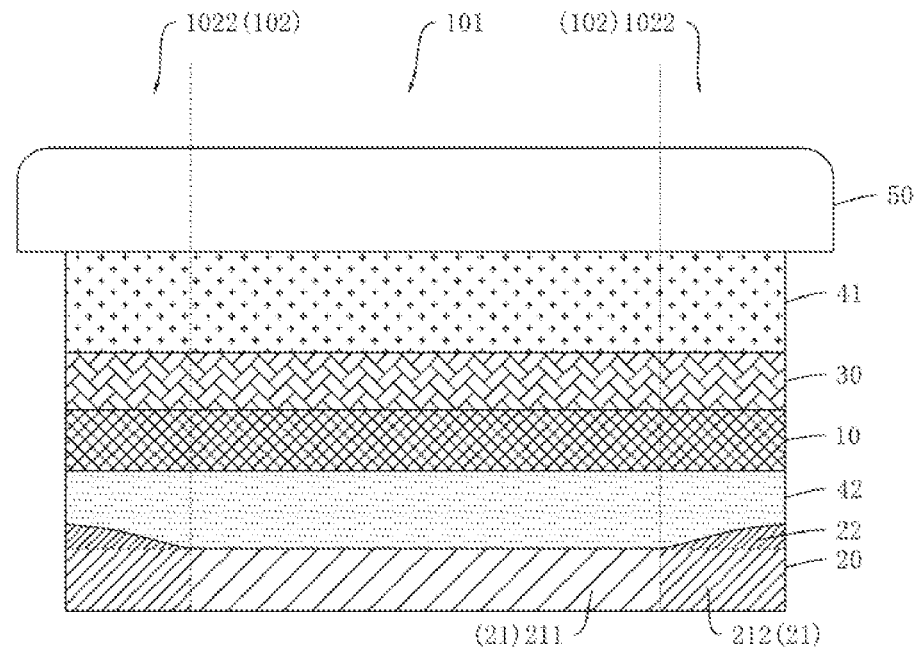
FIG. 8 is another structural schematic diagram of the display panel provided by one embodiment of the present invention.

In another embodiment of the present invention, please refer to FIG. 8. The difference between this embodiment and the previous embodiment is that in the corner curved-surface sub-region 1022, the thickness of the backplate 20 gradually increases along a direction away from the planar display region 101, i.e., the thickness of the thickened portion 22 gradually increases along the direction away from the planar display region 101.

Continuing from the above, in this embodiment, the thickness of the backplate 20 is made to be in a gradually changed trend, which lowers probability of the wrinkles generated in the display panel to improve yield of the display panels and the display effect in corner curved-surface sub-regions 1022, while can also prevent from a poor phenomenon due to stress concentration incurred by sudden change in the thickness of the backplate 20.

Figure 9:
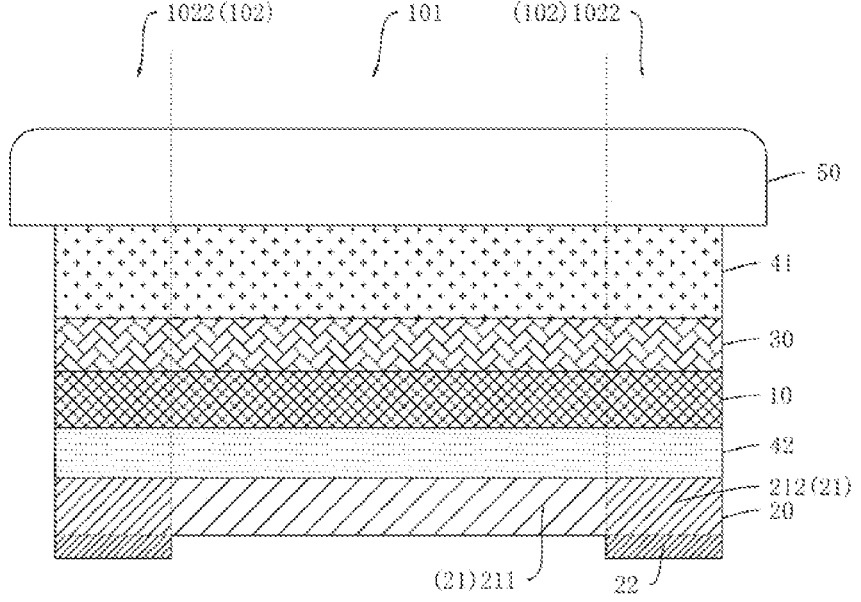
FIG. 9 is another structural schematic diagram of the display panel provided by one embodiment of the present invention.

In another embodiment of the present invention, please refer to FIG. 9. The difference between this embodiment and the first embodiment is that the thickened portion 22 is disposed on a side of the backplate body 21 away from the panel main body 10.

In this embodiment, the elasticity modulus of the thickened portion 22 and the elasticity modulus of the second sub-section 212 are both less than the elasticity modulus of the first sub-section 211. Because the thickened portion 22 and the second sub-section 212 are located in the corner curved-surface sub-region 1022, they need to enter the Gaussian curved surface for bending. Therefore, the elastic modulus of the thickened portion 22 and the second sub-section 212 are configured to be smaller than the elasticity modulus of the first sub-section 211 to improve flexibility of the thickened portion 22 and the second sub-section 212, thereby reducing a bending stress. Additionally, the elasticity modulus of the thickened portion 22 is further less than the elasticity modulus of the second sub-section 212. When the display panel is bent, as the thickened portion 22 is located on a bending inner side, the thickened portion 22 suffers more extrusion and bending stress than the second sub-section 212. Therefore, the elastic modulus of the thickened portion 22 is configured to be smaller to further improve the flexibility of the thickened portion 22.

Continuing from the above, the thickness of the backplate 20 is made to be greater than the thickness of the polarizer sheet 30 at least in the corner curved-surface sub-region 1022 in the embodiment of the present invention. Therefore, compared to the thickness of the polarizer sheet being generally greater than the thickness of a backplate in the prior art, the thickness of the backplate 20 located in the corner curved-surface sub-region 1022 can be increased. By increasing the thickness of the backplate 20 in the corner curved-surface sub-region 1022, the stress threshold of wrinkles generated in the display panel is increased, and probability of the wrinkles generated in the display panel is reduced, so as to improve yield of the display panel and display effect in the corner curved-surface sub-region 1022.

Figure 10:
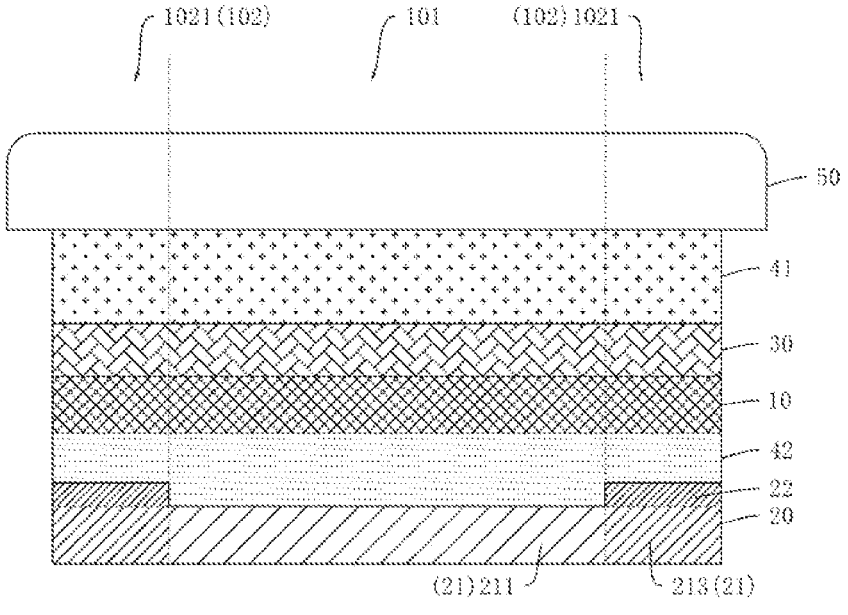
FIG. 10 is another structural schematic diagram of the display panel provided by one embodiment of the present invention.

In another embodiment of the present invention, please refer to FIG. 6, FIG. 7, and FIG. 10. FIG. 10 is a schematic view of a sectional structure along line BB in FIG. 7. The difference between this embodiment and the first embodiment is that at least in the lateral-side curved-surface sub-region 1021 and the corner curved-surface sub-region 1022, the thickness of the backplate 20 is greater than the thickness of the polarizer sheet 30.

It can be understood that the thickness of the backplate 20 in the corner curved-surface sub-region 1022 is greater than the thickness of the backplate 20 in the lateral-side curved-surface sub-region 1021, and the thickness of the backplate 20 in the lateral-side curved-surface sub-region 1021 is greater than the thickness of the backplate 20 in the planar display region 101. That is, in this embodiment, by thickening all the parts of the backplate 20 located in the curved-surface display region 102, the probability of wrinkles generated in the curved-surface display region 102 due to bending is effectively lowered. Furthermore, because the bending curvature of the backplate 20 in the corner curved-surface sub-region 1022 is larger, the thickness of the backplate 20 in the corner curved-surface sub-region 1022 is the largest. Compared to the lateral-side curved-surface sub-region 1021, the probability of the wrinkles generated in the backplate 20 can be further lowered.

Furthermore, the backplate 21 further includes a third sub-section 213 disposed in the lateral-side curved-surface sub-region 1021, and an elasticity modulus of the third sub-section 213 is less than an elasticity modulus of the first sub-section 211, so as to improve the flexibility of the backplate 20 located in the lateral-side curved-surface sub-region 1021 to reduce the bending stress. The elasticity modulus of the third sub-section 213 can be further greater than the elasticity modulus of the second sub-section 212. Because the bending curvature in the corner curved-surface sub-region 1022 is the largest, the elasticity modulus of the third sub-section 213 in this embodiment is the smallest, so as to realize a gradient design of the elastic modulus of the backplate 20 to meet requirements for flexibility in different regions.

Continuing from the above, the thickness of the backplate 20 is made to be greater than the thickness of the polarizer sheet 30 at least in the corner curved-surface sub-region 1022 in the embodiment of the present invention. Therefore, compared to the thickness of the polarizer sheet being generally greater than the thickness of a backplate in the prior art, the thickness of the backplate 20 located in the corner curved-surface sub-region 1022 can be increased. By increasing the thickness of the backplate 20 in the corner curved-surface sub-region 1022, the stress threshold of wrinkles generated in the display panel is increased, and probability of the wrinkles generated in the display panel is reduced, so as to improve yield of the display panel and display effect in the corner curved-surface sub-region 1022.

In other embodiments of the present invention, within the range of the entire display region, i.e., within the range of the planar display region 101 and the curved-surface display region 102, the thickness of the backplate 20 is greater than the thickness of the polarizer sheet 30, as illustrated in FIG. 1. That is, in this embodiment, the entire backplate 20 is thickened, and the thickness of the backplate 20 in the lateral-side curved-surface sub-region 1021 and the thickness of the backplate 20 in the corner curved-surface sub-region 1022 are equal to the thickness of the backplate 20 in the planar display region 101. In this embodiment, the thickened portion can cover the side of the backplate body close to the panel main body 10 or can cover the side of the backplate body away from the panel main body 10 with its entire surface (not shown in the figure).

In addition, in the situation of the entire backplate 20 being thickened, the thickness of the backplate 20 can also be configured in a gradient manner. That is, the thickness of the backplate 20 in the corner curved-surface sub-region 1022 is greater than the thickness of the backplate 20 in the lateral-side curved-surface sub-region 1021, and the thickness of the backplate 20 in the lateral-side curved-surface sub-region 1021 is greater than the thickness of the backplate 20 in the planar display region 101.

Furthermore, the elastic modulus of the backplate 20 in the curved-surface display region 102 is smaller than the elastic modulus of the backplate 20 in the planar display region 101, and the elastic modulus of the back plate 20 in the corner curved-surface sub-region 1022 is smaller than the elastic modulus of the backplate 20 in the lateral-side curved-surface sub-region 1021, so as to realize a gradient design of the elastic modulus of the backplate 20 to meet requirements for flexibility in different regions.

Continuing from the above, the thicknesses of the backplate 20 in the planar display region 101 and the curved-surface display region are made to be both greater than the thickness of the polarizer sheet 30. That is, the entire backplate 20 is thickened to improve the yield of the display panel and the display effect in the corner curved-surface sub-region 1022, while thickness difference of the backplate 20 is not necessary to be configured, which simplifies manufacturing difficulty and the manufacturing process of the backplate 20.

It should be noted that, in one embodiment of the present invention, as the thicknesses of the backplate 20, the polarizer sheet 30, and the adhesive layer 41 increase, the extent of the wrinkles generated in the corner curved-surface sub-region 1022 of the display panel can be reduced. However, when the thickness of the backplate 20 is too large, a phenomenon of poor attachment of the backplate 20 in the corner curved-surface sub-region 1022 can appear. In addition, since the elastic modulus of the polarizer sheet 30 is relatively large, which is generally about 4000 MPa, so hardness of the polarizer sheet 30 is relatively large. If the thickness of the polarizer sheet 30 is too large, the polarizer sheet 30 cannot be easily bent, then a peeling-off phenomenon can easily occur during the attachment process of the display module 60 and the cover plate 50. Furthermore, when the thickness of the adhesive layer 41 is too large, it is easy to affect light transmission of the display panel and reduces the display effect of the display panel.

Continuing from the above, optionally, at least in the corner curved-surface sub-region 1022, the thickness of the backplate 20 can be greater than or equal to 90 µm and can be less than or equal to 250 µm, the thickness of the polarizer sheet 30 can be greater than or equal to 66 µm and can be less than or equal to 106 µm, and the thickness of the adhesive layer 41 can be greater than or equal to 100 µm and can be less than or equal to 200 µm. Furthermore, in the aforesaid thickness range, the thickness of the backplate 20 is greater than the thickness of the polarizer sheet 30, so as to further lower the extent of the wrinkles generated in the display panel.

Please combine with FIG. 1, FIG. 11, FIG. 12, and FIG. 13. In one embodiment of the present invention, the thicknesses of the backplate 20, the polarizer sheet 30, and the adhesive layer 41 are configured, and the extent of reducing the wrinkles is verified when the backplate 20, the polarizer 30, and the adhesive layer 41 have configured thicknesses in the corner curved-surface sub-region 1022.

Figure 11:
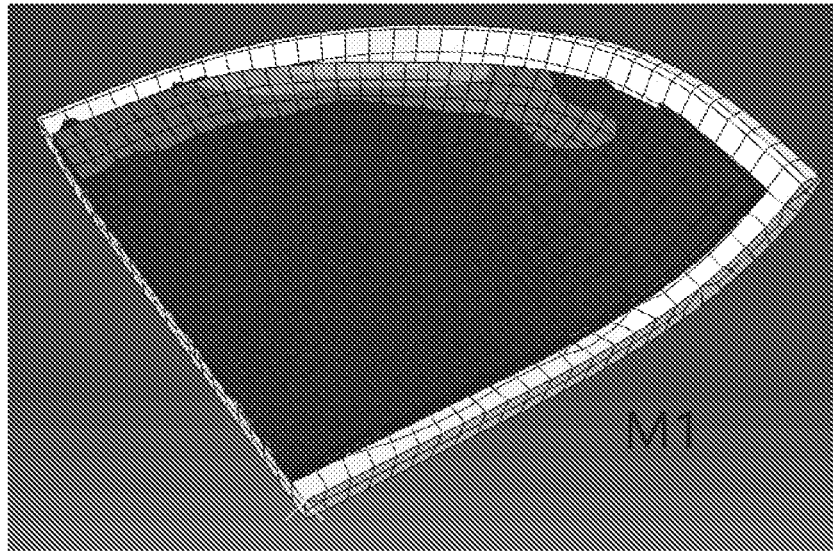
FIG. 11 is an emulation diagram of the wrinkles generated in the display panel in an embodiment M1 provided by one embodiment of the present invention.
Figure 13:
FIG. 13 is a real-object comparison diagram of generation of the wrinkles between the display panel in the embodiment M1 and the display panel in the embodiment M2 provided by one embodiment of the present invention.

Wherein, thickness of the backplate 20 being 150 µm, the thickness of the polarizer sheet 30 being 106 µm, and the thickness of the adhesive layer 41 being 200 µm are taken to satisfy the thickness of the adhesive layer 41 being greater than the thickness of the backplate 20 and the thickness of the backplate 20 being greater than the thickness of the polarizer sheet 30, and are recorded as an embodiment M1 for verification, and the results are shown in FIG. 11 and FIG. 13.

Figure 12:
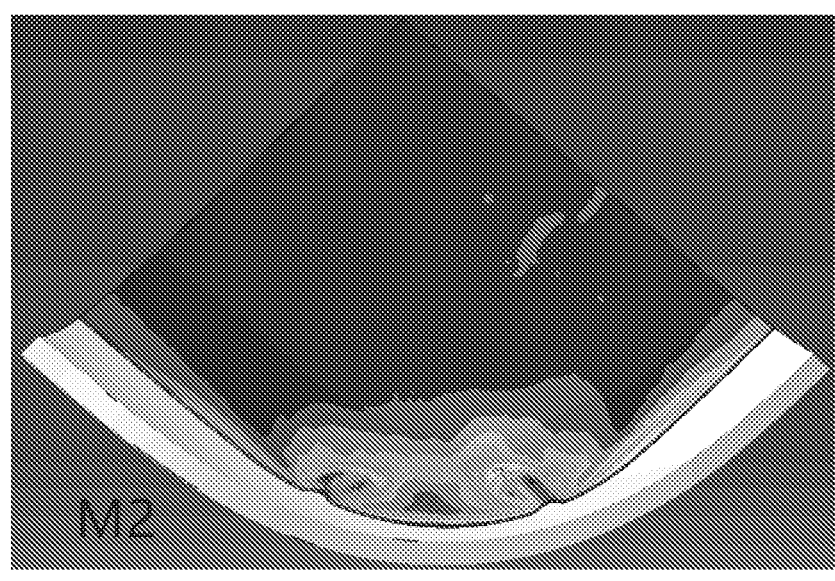
FIG. 12 is an emulation diagram of the wrinkles generated in the display panel in an embodiment M2 provided by one embodiment of the present invention.

The thickness of the backplate 20 being 90 µm, the thickness of the polarizer sheet 30 being 66 µm, and the thickness of the adhesive layer 41 being 100 µm are taken to satisfy the thickness of the adhesive layer 41 being greater than the thickness of the backplate 20 and the thickness of the backplate 20 being greater than the thickness of the polarizer sheet 30, and are recorded as an embodiment M2 for verification, and the results are shown in FIG. 12 and FIG. 13.

From FIG. 11, FIG. 12, and FIG. 13, it can be understood that with increment of the thicknesses of the backplate 20, the polarizer sheet 30, and the adhesive layer 41, i.e., the thicknesses of the backplate 20, the polarizer sheet 30, and the adhesive layer 41 in the embodiment M1 are increased compared to those in the embodiment M2, and under a condition that other film layers of the display panel remain unchanged, the thickness of the display panel in the embodiment M1 is increased by 200 µm compared to the display panel in the embodiment M2. Wherein, wrinkles still appear in the display panel in the embodiment M2. However, with increment of the thicknesses of the backplate 20, the polarizer sheet 30, and the adhesive layer 41, wrinkles in the display panel in the embodiment M1 are basically eliminated.

In the light of this, in the embodiment of the present invention, as the thicknesses of the backplate 20, the polarizer sheet 30, and the adhesive layer 41 are increased, the extent of the wrinkles generated in the display panel can be reduced.

Furthermore, when the thickness of the backplate 20 is greater than 90 µm, and the thickness continues increasing, the extent of the wrinkles generated in the display panel decreases. Moreover, when the thickness of the backplate 20 reaches 150 µm, the wrinkles are basically eliminated in the display panel. Therefore, preferably, at least in the corner curved-surface sub-region 1022, the thickness of the backplate 20 can be greater than or equal to 90 µm and can be less than or equal to 150 µm.

Furthermore, the backplate 20 and the polarizer sheet 30 are thickened to reduce the extent of the wrinkles generated in the display panel in one embodiment of the present invention. However, because the elastic modulus of the polarizer sheet 30 is relatively large, when the thickened extent of the polarizer sheet 30 is relatively large, the film layer peeling-off phenomenon is more easily to occur during attachment. Therefore, the thickened extent of the backplate 20 needs to be greater than the thickened extent of the polarizer sheet 30. Furthermore, according to the aforesaid verification results, the difference between the thickness of the backplate 20 and the thickness of the polarizer sheet 30 can be greater than or equal to 40 μm to ensure the effect of easing the wrinkles in the display panel.

Continuing from the above, in the embodiment of the present invention, the thicknesses of the backplate 20, the polarizer sheet 30, and the adhesive layer 41 are configured, and the configured thicknesses are verified. It has been shown that in the corner curved-surface sub-region 1022 of the display panel, as the thickness of the backplate 20 is increased and is larger than the thickness of the polarizer sheet 30, the phenomenon of the wrinkles generated in the corner curved-surface sub-region 1022 of the display panel can be effectively eased. Meanwhile, increasing the thickness of the adhesive layer 41 is also beneficial to ease the phenomenon of the wrinkles generated in the display panel, i.e., the embodiment of the present invention can improve the yield of the display panel.

Figure 14:
FIG. 14 is a structural schematic diagram of a panel main body provided one embodiment of the present invention.
Figure 15:
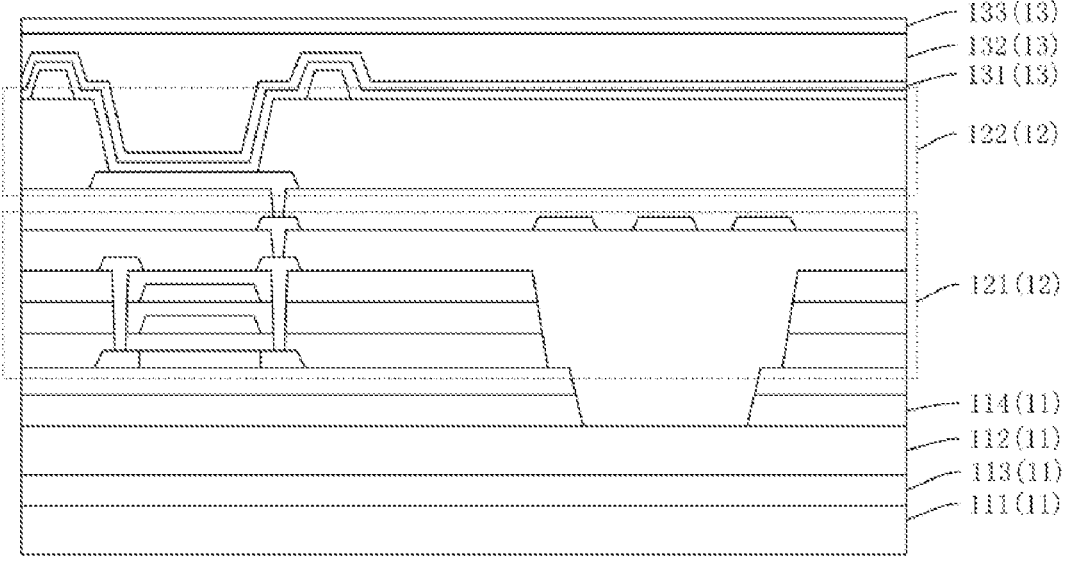
FIG. 15 is another structural schematic diagram of the panel main body provided one embodiment of the present invention.

In one embodiment, please refer to FIG. 1, FIG. 14, and FIG. 15. The panel main body 10 includes a substrate 11, a display function layers 12 sequentially disposed on a side of the substrate 11 close to the polarizer sheet 30, and an encapsulation layer 13 disposed on the side of the display function layer 12 close to the polarizer sheet 30.

Specifically, the substrate 11 includes a first organic flexible layer 111, a first water-and-oxygen barrier layer 113, a second organic flexible layer 112, and a second water-and-oxygen barrier layer 114 sequentially disposed in a stack. Wherein, materials of the first organic flexible layer 111 and the second organic flexible layer 112 can both be polyimide, and materials of the first water—and—oxygen barrier layer 113 and the second water-and-oxygen barrier layer 114 can both include at least one of silicon oxide or silicon nitride.

In one embodiment of the present invention, a thickness of the first organic flexible layer 111 is less than 10 μm, i.e., less than a thickness of a polyimide flexible substrate layer located at the lowest layer in a current display panel, so as to reduce the thickness of the panel main body 10 in the embodiment of the present invention. Therefore, bending performance of the panel main body 10 in the corner curved-surface sub-region 1022 is improved, the bending stress received by the panel main body 10 is reduced, the probability of damage to the panel main body 10 due to stress concentration in the corner curved-surface sub-region 1022 incurred by excessive bending curvature is reduced, and the yield of the display panel is increased.

Furthermore, the thickness of the first organic flexible layer 111 also needs to be greater than or equal to 6 μm, so as to prevent the laser energy from causing damage to elements in the panel main body 10 during performing a laser peeling-off process on a glass substrate of the display panel.

Optionally, the thickness of the first organic flexible layer 111 is equal to a thickness of the second organic flexible layer 112, and it is 6 μm.

Furthermore, the display function layer 12 can include a thin film transistor layer 121 and a light-emitting function layer 122. Wherein, the thin film transistor layer 121 includes a thin film transistor and an insulation layer covering the thin film transistor. Furthermore, the light-emitting function layer 122 includes an anode, a pixel definition layer, an organic light-emitting layer, and a cathode layer disposed on the insulation layer. The anode is electrically connected to the thin film transistor to realize signal transmission. The aforesaid structures can be realized with reference to conventional processes, and unnecessary details will not be given herein again.

The encapsulation layer 13 is disposed on a side of the cathode layer away from the substrate 11, and the encapsulation layer 13 includes a first inorganic layer 131, an organic layer 132, and a second inorganic layer 132 sequentially disposed on the cathode layer in a stack. In the embodiment of the present invention, the thickness of the organic layer 132 is less than or equal to 10 μm, which is less than the thickness of an organic encapsulation layer in the current display panel, so as to further decrease the thickness of the panel main body 10. Therefore, the bending performance of the panel main body 10 in the corner curved-surface sub-region 1022 is further improved, the bending stress received by the panel main body 10 is reduced, the probability of damage to the panel main body 10 due to stress concentration in the corner curved-surface sub-region 1022 incurred by excessive bending curvature is reduced, and the yield of the display panel is increased.

In addition, the thickness of the organic layer 132 also needs to be greater than or equal to 8 μm to ensure that level can be realized on the organic layer 132 during the manufacturing process, so as to ensure encapsulation effect of the encapsulation layer 13.

In addition, the display panel provided by one embodiment of the present invention further includes a functional film layer disposed on a side of the backplate 20 away from the panel main body 10, which can specifically include a light-shielding film 81 disposed on a side of the backplate 20 away from the panel main body 10, and a buffer layer 82 disposed on a side of the light-shielding film 81 away from the backplate 20. Optionally, a material of the buffer layer 82 can be acrylic foam; or the material of the buffer layer 82 can also be a combination of the acrylic foam and a metal material, so that the buffer layer 82 can also serve a heat dissipation effect while serves a buffer effect. Wherein, the metal material can be aluminum or copper.

In other embodiments of the present invention, the functional film layer can also include a heat dissipation material layer 84 disposed on a side of the buffer layer 82 away from the light-shielding film 81, and an electromagnetic shielding layer 85 disposed on a side of the heat dissipation material layer 84 away from the buffer layer 82. Wherein, the heat dissipation material layer 84 can be attached to the buffer layer 82 through the second adhesive layer 83.

Furthermore, lengths of the heat dissipation material layer 84 and the electromagnetic shielding layer 85 along a direction parallel to the display panel are both smaller than lengths of other film layers of the display panel along the direction parallel to the display panel. That is, the heat dissipation material layer 84 and the electromagnetic shielding layer 85 are indented at one end of the display panel to form a space on a side of the buffer layer 82 away from the backplate 20. Furthermore, after the display panel is bonded and bent, the space can be used to place a driver chip that has been bonded and bent to the side of the buffer layer 82 away from the backplate 20 (not shown in the figure).

In summary, in the embodiments of the present invention, by configuring the thickness of the backplate 20 to be greater than the thickness of the polarizer sheet 30 at least in the corner curved-surface sub-region 1022, the extent of the wrinkles generated in the corner curved-surface sub-region 1022 of the display panel can be effectively reduced, the yield of the display panel can be increased, and the display effect of the curved surface in the display panel can be improved. Furthermore, within the thickness range configured in the embodiments of the present invention, increasing the thicknesses of the backplate 20, the polarizer sheet 30, and the adhesive layer 41 can effectively reduce the extent of wrinkles generated in the corner curved-surface sub-region 1022 of the display panel. Additionally, in the embodiments of the present invention, by decreasing the thickness of the organic film layers in the panel main body 10, bending performance of the panel main body 10 in the corner curved-surface sub-region 1022 is further improved, the bending stress received by the panel main body 10 is reduced, and the probability of damage to the panel main body 10 due to stress concentration in the corner curved-surface sub-region 1022 incurred by excessive bending curvature is reduced, and the yield of the display panel is increased.

In addition, one embodiment of the present invention further provides a display device. The display device includes a device main body and the display panel in the aforesaid embodiments, and the device main body and the display panel are assembled in one piece.

In one embodiment of the present invention, the device body of the device can include a middle frame, a sealant, etc., and the display device can be a display terminal such as a mobile phone, a tablet, a television, etc., which is not limited herein.

In the above embodiments, the description of each embodiment has its emphasis, and for some embodiments that may not be detailed, reference may be made to the relevant description of other embodiments.

The embodiments of the display panel and the display device provided by the present invention are described in detail above. This article uses specific cases for describing the principles and the embodiments of the present invention, and the description of the embodiments mentioned above is only for helping to understand the method and the core idea of the present invention. It should be understood by those skilled in the art, that it can perform changes in the technical solution of the embodiments mentioned above, or can perform equivalent replacements in part of technical characteristics, and the changes or replacements do not make the essence of the corresponding technical solution depart from the scope of the technical solution of each embodiment of the present invention.

What is claimed is:

1. A display panel, comprising a planar display region and a curved-surface display region neighboring with the planar display region, wherein the curved-surface display region comprises a plurality of lateral-side curved-surface sub-regions defined on periphery of the planar display region and a corner curved-surface sub-region connected between adjacent two of the plurality of lateral-side curved-surface sub-regions;

wherein the display panel comprises:

a panel main body;

a backplate disposed on a side of the panel main body; and a polarizer sheet disposed on a side of the panel main body away from the backplate, wherein at least in the corner curved-surface sub-region, a thickness of the backplate is greater than a thickness of the polarizer sheet;

wherein the thickness of the backplate in the corner curved-surface sub-region is greater than the thickness of the backplate in the lateral-side curved-surface sub-region.

2. The display panel as claimed in claim 1, wherein the thickness of the backplate is greater than the thickness of the polarizer sheet in the lateral-side curved-surface sub-region.

3. The display panel as claimed in claim 2, wherein the thickness of the backplate is greater than the thickness of the polarizer sheet in the planar display region.

4. The display panel as claimed in claim 2, wherein the thickness of the backplate in the curved-surface display region is greater than the thickness of the backplate in the planar display region.

5. The display panel as claimed in claim 3, wherein the thickness of the backplate in the corner curved-surface sub-region is equal to the thickness of the backplate in the lateral-side curved-surface sub-region and is equal to the thickness of the backplate in the planar display region.

6. The display panel as claimed in claim 1, wherein in the corner curved-surface sub-region, the thickness of the backplate gradually increases along a direction away from the planar display region.

7. The display panel as claimed in claim 1, wherein at least in the corner curved-surface sub-region, the thickness of the backplate is greater than or equal to 90 μm and is less than or equal to 250 μm, and the thickness of the polarizer sheet is less than or equal to 106 μm.

8. The display panel as claimed in claim 1, wherein at least in the corner curved-surface sub-region, a difference between the thickness of the backplate and the thickness of the polarizer sheet is greater than or equal to 40 μm.

9. The display panel as claimed in claim 1, wherein the display panel comprises an adhesive layer disposed on a side of the polarizer sheet away from the display panel and a cover plate disposed on a side of the adhesive layer away from the polarizer sheet, and a thickness of the adhesive layer is greater than the thickness of the backplate at least in the corner curved-surface sub-region.

10. The display panel as claimed in claim 9, wherein at least in the corner curved-surface sub-region, the thickness of the adhesive layer is greater than or equal to 100 μm and is less than or equal to 200 μm.

11. The display panel as claimed in claim 1, wherein the backplate includes a backplate body and a thickened portion disposed on a side of the backplate body close to the panel main body or a side of the backplate body away from the panel main body, and the thickened portion is at least disposed in the corner curved-surface sub-region.

12. The display panel as claimed in claim 11, wherein a material of the thickened portion is same or different as a material of the backplate body.

13. The display panel as claimed in claim 11, wherein the backplate body comprises a first sub-section disposed in the planar display region and a second sub-section disposed in the corner curved-surface sub-region, and an elasticity modulus of the first sub-section is greater than an elasticity modulus of the second sub-section.

14. The display panel as claimed in claim 13, wherein the backplate is bent along a side away from the panel main body in the curved-surface display region; and wherein the thickened portion is located on a side of the backplate body close to the panel main body and is located in the corner curved-surface sub-region, and an elasticity modulus of the thickened portion is greater than the elasticity modulus of the second sub-section and is less than the elasticity modulus of the first sub-section; or the thickened portion is located on a side of the backplate away from the panel main body and is located in the corner curved-surface sub-region, and the elasticity modulus of the thickened portion is less than the elasticity modulus of the second sub-section.

15. The display panel as claimed in claim 1, wherein the panel main body comprises a substrate and a display function layer disposed on a side of the substrate close to the polarizer sheet, the substrate comprises a first organic flexible layer and a second organic flexible layer, the second organic flexible layer is located between the first organic flexible layer and the display function layer, and a thickness of the first organic flexible layer is less than 10 μm.

16. The display panel as claimed in claim 15, wherein a thickness of the first organic flexible layer is greater than or equal to 6 μm.

17. The display panel as claimed in claim 15, wherein the panel main body comprises an encapsulation layer disposed on a side of the display function layer away from the substrate, the encapsulation layer comprises a first inorganic layer, an organic layer, and a second inorganic layer disposed in a stack, and a thickness of the organic layer is less than or equal to 10 μm.

18. The display panel as claimed in claim 1, wherein in the corner curved-surface sub-region, at least part of the display panel is curved in a form of a Gaussian curve surface, and a compression rate of the display panel curved in the form of the Gaussian curve surface is greater than or equal to 0.2.

19. A display device, comprising a device main body and a display panel, wherein the device main body and the display panel are assembled in one piece;

wherein the display panel includes a planar display region and a curved-surface display region neighboring with the planar display region, wherein the curved-surface display region comprises a plurality of lateral-side curved-surface sub-regions defined on periphery of the planar display region and a corner curved-surface sub-region connected between adjacent two of the plurality of lateral-side curved-surface sub-regions;

wherein the display panel comprises:

a panel main body;

a backplate disposed on a side of the panel main body; and a polarizer sheet disposed on a side of the panel main body away from the backplate; and wherein at least in the corner curved-surface sub-region, a thickness of the backplate is greater than a thickness of the polarizer sheet;

wherein in the corner curved-surface sub-region, the thickness of the backplate gradually increases along a direction away from the planar display region.

20. A display panel, comprising a planar display region and a curved-surface display region neighboring with the planar display region, wherein the curved-surface display region comprises a plurality of lateral-side curved-surface sub-regions defined on periphery of the planar display region and a corner curved-surface sub-region connected between adjacent two of the plurality of lateral-side curved-surface sub-regions;

wherein the display panel comprises:

a panel main body;

a backplate disposed on a side of the panel main body; and a polarizer sheet disposed on a side of the panel main body away from the backplate, wherein at least in the corner curved-surface sub-region, a thickness of the backplate is greater than a thickness of the polarizer sheet;

wherein the display panel comprises an adhesive layer disposed on a side of the polarizer sheet away from the display panel and a cover plate disposed on a side of the adhesive layer away from the polarizer sheet, and a thickness of the adhesive layer is greater than the thickness of the backplate at least in the corner curved-surface sub-region.

* * * * *